(12) United States Patent  
Wachtler et al.

(10) Patent No.: US 8,309,388 B2
(45) Date of Patent: Nov. 13, 2012

(54) MEMS PACKAGE HAVING FORMED METAL LID

(75) Inventors: Kurt P. Wachtler, Richardson, TX (US); Wei-Yan Shih, Plano, TX (US); Gregory E. Howard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 847 days.

(21) Appl. No.: 12/337,320

(22) Filed: Dec. 17, 2008

(65) Prior Publication Data

US 2009/0267223 A1   Oct. 29, 2009

Related U.S. Application Data

(60) Provisional application No. 61/047,919, filed on Apr. 25, 2008.

(51) Int. Cl.
*H01L 23/10* (2006.01)

(52) U.S. Cl. .......... 438/64; 257/414; 257/699; 257/708; 257/710; 257/E23.181; 438/48; 438/51; 438/121

(58) Field of Classification Search .......... 257/414, 257/699, 708, 710, E23.181; 438/48, 51, 438/64, 121
See application file for complete search history.

(56) References Cited

U.S. PATENT DOCUMENTS

| 3,673,309 A * | 6/1972 | Dalmasso .................. 174/554 |
| 2004/0108588 A1 | 6/2004 | Gilleo |
| 2005/0009246 A1 | 1/2005 | Enquist et al. |
| 2006/0211177 A1 | 9/2006 | Schaper et al. |

FOREIGN PATENT DOCUMENTS

| EP | 01640320 A2 | 3/2006 |
| JP | 2007214439 A | 8/2007 |

OTHER PUBLICATIONS

"Wafer-Level-Package for Bulk Acoustic Wave (BAW) Filters", M. Franosch, et al., 2004 IEEE-MTT-S Digest, pp. 493-496.
"Low Cost Packages for MEMS Oscillators", Wan-Thai Hsu, 2007 IEEE Int'l Electronics Manufacturing Technology Symposium, pp. 273-277.
"Application of Microforging to SiCN MEMS Fabrication",Y. Liu et al, Sensors and Actuators A: Physical vol. 95, Jan. 2002, pp. 143-151.

* cited by examiner

*Primary Examiner* — Peniel M Gumedzoe
(74) *Attorney, Agent, or Firm* — Steven A. Shaw; W. James Brady; Frederick J. Telecky, Jr.

(57) ABSTRACT

A hermetic MEMS device (100) comprising a carrier (110) having a surface (111) including a device (101) and an attachment stripe (122), the stripe spaced from the device and surrounding the device; a metallic foil (102) having a central bulge portion (103) and a peripheral rim portion (104) meeting the stripe, the bulge cross section parallel to the carrier monotonically decreasing from the rim (104) towards the bulge apex (105); and the foil positioned over the carrier surface so that the bulge arches over the device and the rim forms a seal with the stripe.

9 Claims, 9 Drawing Sheets

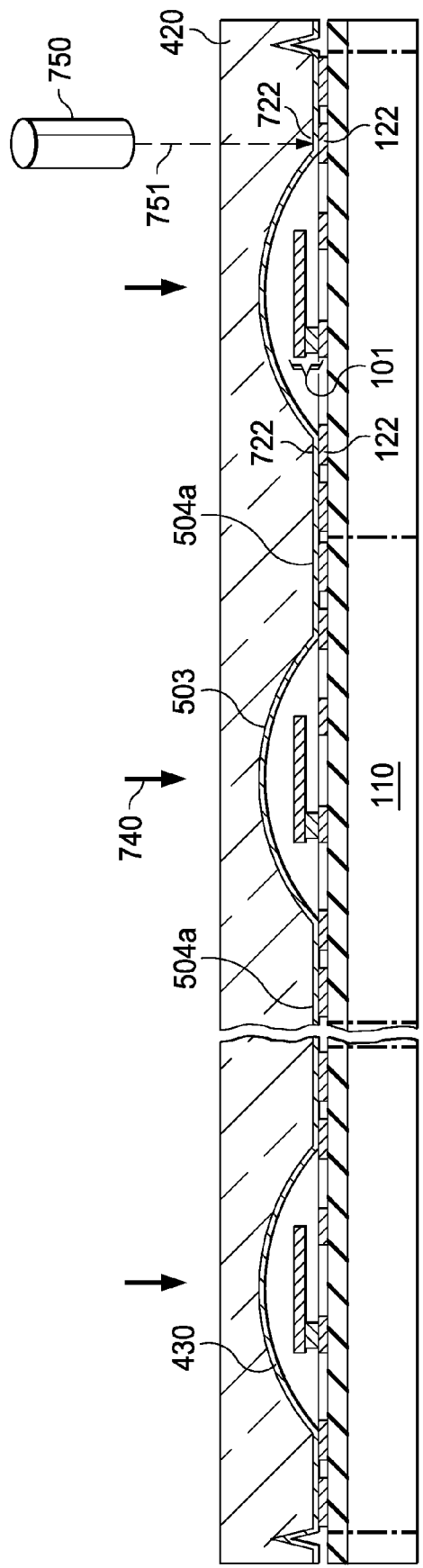
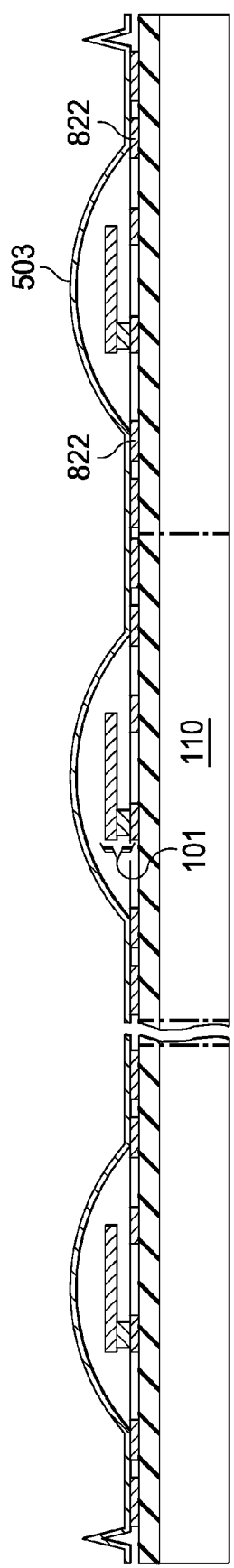
FIG. 7
FIG. 8

MEMS PACKAGE HAVING FORMED METAL LID

FIELD OF THE INVENTION

The present invention is related in general to the filed of semiconductor devices and processes, and more specifically to the structure and fabrication method of robust, low cost, and mass-produced packages for Micro-Electro-Mechanical devices (MEMS).

DESCRIPTION OF RELATED ART

The wide variety of products collectively called Micro-Electro-Mechanical devices (MEMS) are small devices on the micrometer scale, which have mechanically moving parts and often movable electrical power supplies and controls. Because of the moving parts, MEMS have a need for physical and atmospheric protection. Consequently, MEMS are placed on a robust substrate and have to be surrounded by a housing or package, which has to shield the MEMS against ambient and electrical disturbances, and against stress.

For quasi-hermetic encapsulations, which prevent the ingress of nano-particles, but not of water and oxygen molecules, a MEMS package can be built step-by-step with plastic materials and photolithographic techniques in a batch process flow. For example, packages for bulk acoustic wave (BAW) filters have been manufactured, with micrometer accuracy, using three deposition steps for plastic and/or metallic layers and two photolithographic definition steps.

Another example of a quasi-hermetic encapsulation is a cavity for a MEMS device created by a flat metal lid glued by an adhesive polymer onto straight metal walls surrounding the MEMS device. The photolithographic technology for the micrometer-scale package couples the wall thickness to the wall height, requiring a minimum aspect ratio of 1 to 2.

For fully hermetic encapsulations, which prevent the ingress of water and oxygen molecules in addition to nano-particles, a MEMS package is commonly constructed with ceramic materials. These packages are expensive due to their multi-level metallizations. As an example, the large silicon chips of the digital light processors (DLP™ of Texas Instruments), with the deflectable aluminum micro-mirrors on torsion beams and the circuits for the underlying control electrodes, are assembled on ceramic substrates with multi-level metal interconnections. The assembled micro-mirrors are covered by a glass plate sealed to walls on the substrate, allowing light beams to reach the micro-mirrors.

Other devices in fully hermetic packages, such as MEMS resonators, gyroscopes, and accelerometers, may even require the maintenance of a certain level of vacuum for the life of the product to ensure the performance and stability of the vibrating structure. Packages for some of these resonators and oscillators are built along a semiconductor assembly flow using three or four metal layer deposition steps and two or three photolithographic definition steps. In an exemplary assembly flow to pack MEMS resonators into a cavity with pressures of less than $5 \cdot 10^{-2}$ Torr, a packaging process flow for micrometer accuracy requires 3 material deposition steps and 2 photolithographic definition steps as follows: Depositing a sacrificial layer on top of the MEMS resonators; depositing a cap layer over the sacrificial layer; etching release holes through the cap layer to the sacrificial layer; removing the sacrificial layer through the release holes, thus freeing up the resonators; evacuating the freed-up space around the resonators; depositing a sealant layer over the cap layer to seal the release holes; and opening via holes through the sealant layer to contact the cap layer with metal pads. The sequence of process steps makes the packaging technique time consuming and expensive.

SUMMARY OF THE INVENTION

Applicants recognized that the market trends towards higher MEMS reliability and lower cost demand fully hermetic packages but without the cost of multi-metal level ceramic materials. Applicants further saw that for micrometer-scale MEMS packages, today's fabrication flows with repeated photolithographic alignment steps are too cost-intensive and time-consuming; the required sets of photomasks are also in conflict with ongoing market trends of rapidly changing customer demands, short manufacturing turnaround time, and pervasive product diversification.

Applicants solved the problem of mass-producing a fully hermetic yet low cost cavity package for micrometer-scale MEMS devices by forming a foil (preferably made of aluminum or copper) to become a dome-shaped shell fitting the functional MEMS part on the surface of a semiconductor chip, and then by sealing the shell to a stripe (preferably made of aluminum or copper), surrounding the device on the chip surface. Applicants discovered that the thinness of the foil (for example, 5 to 15 µm) enables the sealing to be performed by the energy of a fast-moving laser. The foil-forming process endows mechanical robustness to the shell, which can be strengthened by forming additional support beams. The metal-to-metal seal renders the package hermetic.

The tool, which applicants developed for forming the metal sheet, is low cost and structured for mass-production; furthermore, the tool may serve as a transportation means of a plurality of shells to the assembly station. The tool includes an embosser with a bottom half and a top half. The bottom half has a flat surface with rounded bulges and pointed pins, the bulge locations matching the device locations and the bulge size encompassing the device size. The top half has a flat surface with rounded depressions and pointed indents, the depression locations and size matching the bulge locations and size, and the indent locations and size matching the tip locations and size. After the foil has been squeezed between bottom and top half to form it into the shape of the depressions, the foil clings to the top half due to the attachment to the indents and can thus be transported to the carrier with the devices.

In the preferred embodiment, the embosser has the top half made of a material transparent to energy-carrying radiation such as laser light. After the foil has contacted the stripe, this energy allows the seal to be welded, when both the foil and the attachment stripe are made of suitable metals such as aluminum or copper.

It is a technical advantage of the invention that the stripe may be structured in a variety of shapes, including a low-rise metal pad or a thin metal wall. Since no photolithographic steps are involved, the wall thickness is no longer coupled to the wall height by the minimum aspect ratio of 1 to 2.

It is another technical advantage that the package assembly flow can be integrated into a wafer-scale semiconductor process flow. The resulting cavity package for the MEMS protection has micrometer-scale dimensions and can be made having a low contour dome, allowing low-contour attachment to external parts.

It is another technical advantage that a package according to the invention can be made fully hermetic. The fabrication steps are compatible with batch processing and use low cost materials process steps. Consequently, a hermetic package according to the invention reduces the cost by about 75% compared to ceramic packages. In addition, when complete hermeticity is not required, the metal foil may be sealed to the stripe by a polymeric adhesive.

As a variation of the package concept, the structure and the fabrication process of the electronic device package can be extended to foils made of materials transparent to optical signals. The encapsulated devices may thus be sensitive signal monitors. As another variation, the bulges formed into the flat foils can be strengthened by concurrently embossing additional support beams into the foil. The resulting domes are mechanically strong enough to withstand the atmospheric pressure after partial evacuation of the bulge, thus allowing the operation of MEMS devices in partial vacuum.

BRIEF DESCRIPTION OF THE DRAWINGS

FIGS. 4 to 11 illustrate certain steps of the method for fabricating a package for electronic devices according to the invention.

FIG. 4 is a schematic cross section of the fragmentary embosser used for forming the foil extended between the embosser halves.

FIG. 5 illustrates a schematic cross section of the fragmentary embosser at the process step of closing the embosser halves and forming the foil.

FIG. 6 depicts a schematic cross section of the fragmentary embosser at the process step of lifting the top embosser half with the clinging formed foil.

FIG. 7 shows a schematic cross section of the top fragmentary embosser half after the process step of aligning with respective MEMS devices and the step of applying energy to seal the foil to the device carrier.

FIG. 8 is a schematic cross section of encapsulated MEMS devices on a fragmentary carrier after removing the foil embosser.

FIG. 9 illustrates schematically the process step of removing flat foil portions between the foil bulges.

FIG. 10 depicts schematically discrete encapsulated MEMS devices after the singulation step.

FIG. 11 shows schematically the discrete encapsulated MEMS devices after the process step of attaching broken-off wire bonds for interconnection.

DETAILED DESCRIPTION OF THE PREFERRED EMBODIMENTS

Figure 1:
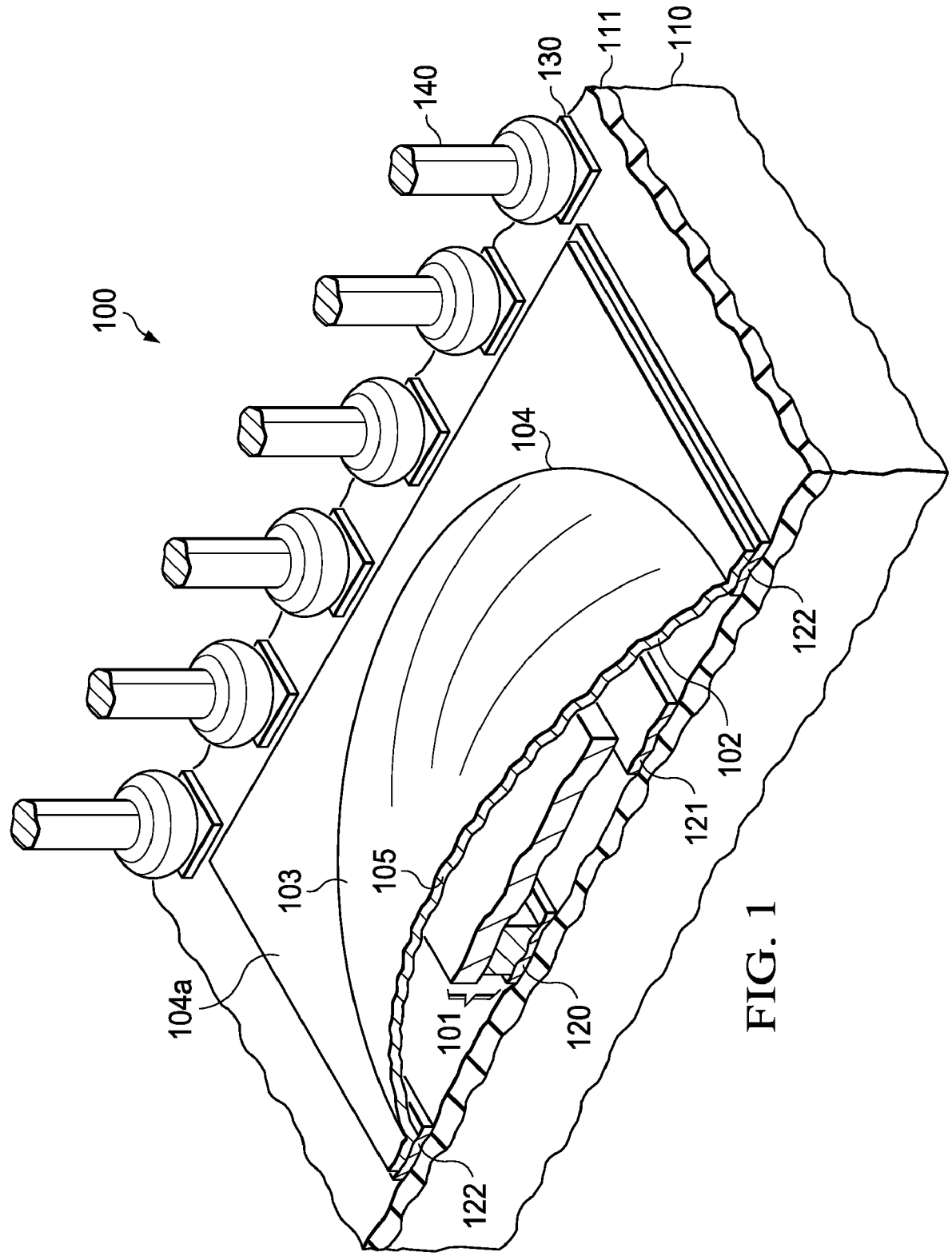
FIG. 1 shows a schematic perspective view and cutaway of a MEMS device in a package fabricated according to the invention.

As an exemplary embodiment of the invention, FIG. 1 illustrates a generalized electronic product, designated 100, which includes a micro-electro-mechanical (MEMS) device 101 packaged under a foil 102 shaped as a bulge or dome 103. The MEMS device 101 may be a resonator, bulk acoustic wave filter, or any microstructure with mechanically moving parts, and have exemplary dimensions such a length between 15 and 20 µm and a height of about 2 µm. Device 101 is attached to a carrier 110, which may be a semiconductor chip including an insulating surface layer 111. Alternatively, carrier 110 may be any other material such as a motherboard or a metal slab; in some devices with a metal slab, it may be preferable to add an insulating surface on the metal. In FIG. 1, device 101 is attached to the carrier by a metal contact 120, which may belong to the same metallization layer as countercontact 121. Metal 120 facilitates electrical connection to contact pads, or bondpads, 130 outside of, and separate from, the dome-shaped foil 102. Attached to bondpads 130 are the metallic connectors 140 to external parts.

Foil 102 is preferably metallic; it may for example include aluminum or copper or alloys thereof. As a metal foil, the preferred thickness range for MEMS is between 5 and 15 µm; however, for applications with devices larger than typical MEMS, the foil may be considerably thicker, even in the millimeter range. Alternatively, foil 102 may be made of a plastic compound to be transparent for radiation, such as optical radiation, especially for focused laser light. When light signals can be transmitted, the MEMS device can be operable as a sensor.

As FIG. 1 indicates, foil 102 has a central bulge portion 103 and a peripheral rim portion 104. As an example, for some MEMS devices, the distance from the center of the bulge to the rim may be between 20 and 50 µm. The rim portion may further include a flat flange 104a, which extends as a single, uninterrupted sheet from the rim portion of the foil. The exemplary FIG. 1 shows bulge 103 to be smooth and approximately circular or ellipsoidal. Cross sections of the bulge parallel to carrier 110 are decreasing monotonically from rim 104 towards bulge apex 105. Bulge 103, however, can have any shape suitable to provide the space for device 101 to operate its movable parts as intended. For instance, bulge 103 may be shaped substantially as a rectangle, or a crescent, or a snake, or an irregular outline.

Figure 2A:
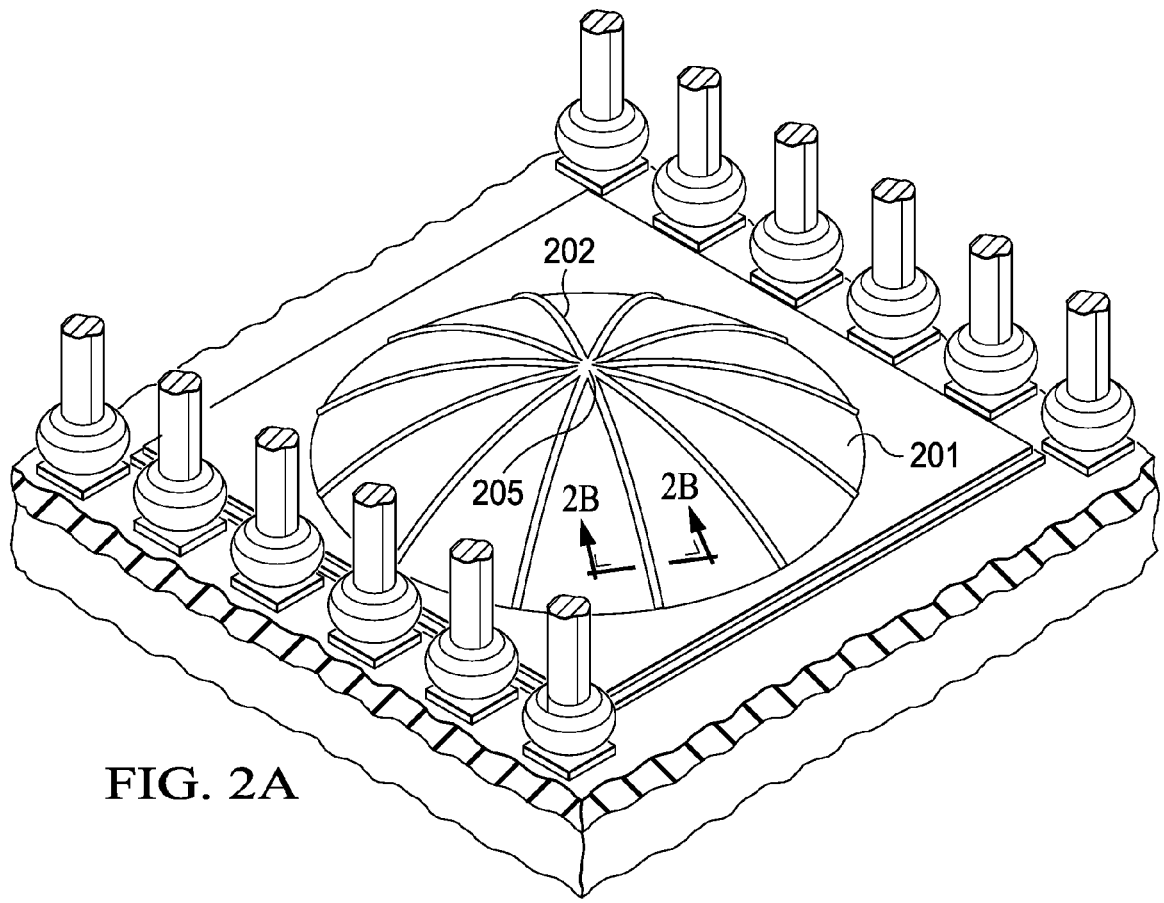
FIG. 2A is a schematic perspective view of another MEMS device with a dome-shaped bulge having embossed structures for enhancing the mechanical strength of the encapsulation.
Figure 2B:
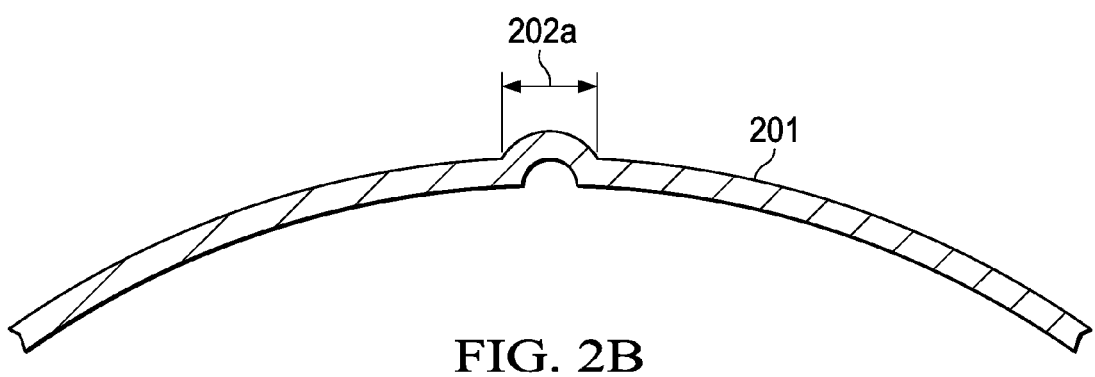
FIG. 2B shows an enlarged cross section of the bulge foil along line 2B-2B in FIG. 2A.

Furthermore, bulge 103 may be structured to include features such as support beams, which endow additional mechanical strength to the bulge in support of the thin foil material used for the bulge. As an example, FIG. 2A illustrates a dome-shaped bulge 201, which has a plurality of elongated protrusions or ribs 202 reaching from the rim portion to the proximity of the apex 205 (the apex itself may be flat). A cross section of the bulge along line 2B-2B is depicted in FIG. 2B, showing an approximately hemispherical embossment 202a in the foil material.

Dependent on the density of the support beams and the size and curvature of the dome-shaped bulge, the support beams allow the construction of a package, wherein the cavity can withstand a pressure of less than $5 \cdot 10^{-2}$ Torr.

For other devices, the support beams enable a package, wherein the cavity under the bulge can be filled with gas (for instance nitrogen) to a pressure in excess of the atmospheric pressure.

Referring now to FIG. 1, product 100 further includes a structure 122 on the surface layer 111 suitable for attaching the foil rim. Structure 122 preferably has the configuration of a stripe spaced from device 101 and surrounding device 101. Preferably, attachment stripe 122 includes a metal such as copper or aluminum, or an alloy thereof. As an example, stripe 122 may be patterned form the topmost metallization layer in a semiconductor fabrication flow. Alternatively, stripe 122 may include a plastic compound, an adhesive compound, or an insulating layer of a semiconductor. Stripe 122 has an overall configuration and width suitable for meeting rim 104 and being attached to rim 104.

In other embodiments, the stripe as a separate body may not be needed. Instead, rim 104 and flange 104a are attached to the carrier 110 directly. In this case, a preferred attachment method employs a polymeric adhesive. In other embodiments, especially when the carrier is metallic, the seal of the metallic foil to the carrier is a metal-to-metal seal.

When strip 122 is a metal, the contact between the foil metal and the strip metal enables a hermetic seal, impermeable not only for particles, but also for molecules such as water and oxygen. A practical method for fabricating a metal-to-metal seal is welding (see below). When carrier 110 is a semiconductor chip or a metal slab, a hermetic seal renders the whole package as shown in FIG. 1 hermetic. Alternatively, when strip 122 is a polymeric compound, or when a polymeric adhesive is used, the contact between the foil and the strip is only semi-hermetic; it is impermeable for particles, but not for water and oxygen molecules. Strip 122 and thus the seal can be held narrow and small, for instance to a few micrometers.

As pointed out above, when bulge portion 103 in FIG. 1 is made of a single sheet of foil, the bulge cross sections parallel to carrier 110 decrease monotonically from rim 104 to apex 105. In addition, when the peripheral rim portion 104 has a flange 104a, the flange extends seamlessly from the rim portion; a flat flange 104a is parallel to the carrier 110.

Figure 3A:
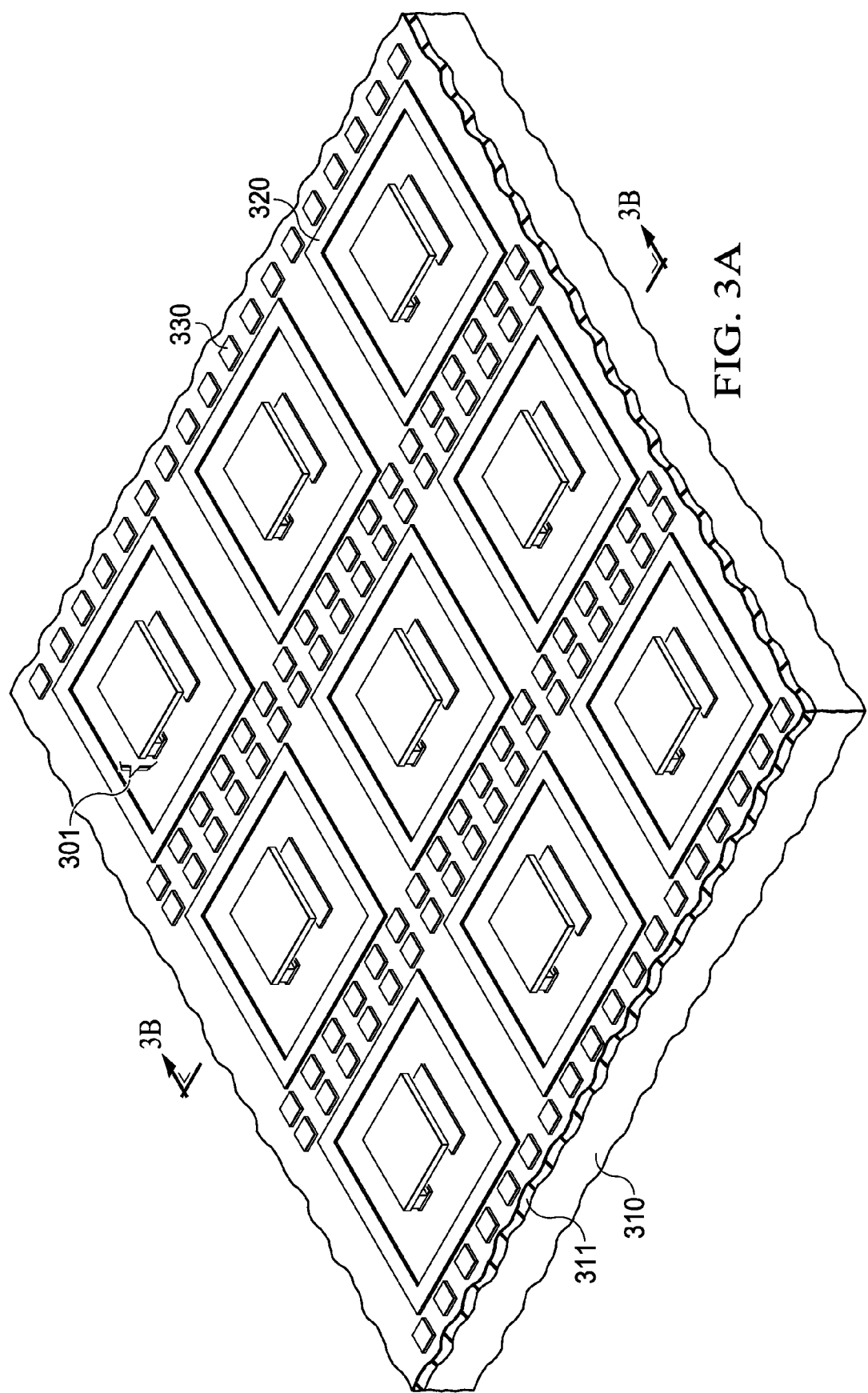
FIG. 3A is a schematic fragmentary perspective view of a semiconductor carrier having a plurality of MEMS devices on the carrier surface.
Figure 3B:
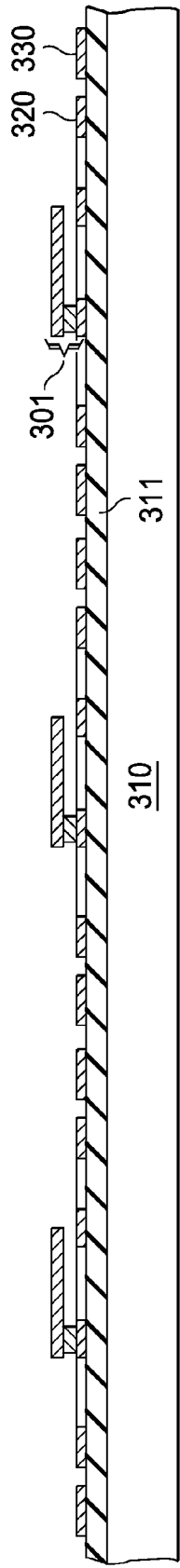
FIG. 3B shows a schematic cross section of the semiconductor carrier in FIG. 3A along line 3B-3B.

In order to illustrate the manufacturing process flow of batch-packaging a plurality of MEMS devices 301 in low-cost encapsulations, FIG. 3A gives a schematic example of a portion of a semiconductor wafer 310 with a two-dimensional regular array of MEMS devices 301 on the wafer surface 311. Devices 301 are located in device locations. In other examples, the devices may be in irregular or singular locations. Each MEMS device 301 is surrounded by an assembly stripe 320, preferably made of a metal such as aluminum. A plurality of metal pads 330, preferably made of copper, serve as locations for electrical connections to the respective device. A cross section of the wafer along line 3B-3B is depicted in FIG. 3B; this cross section will be used in FIGS. 7 to 11 to illustrate certain process steps.

Figure 4:
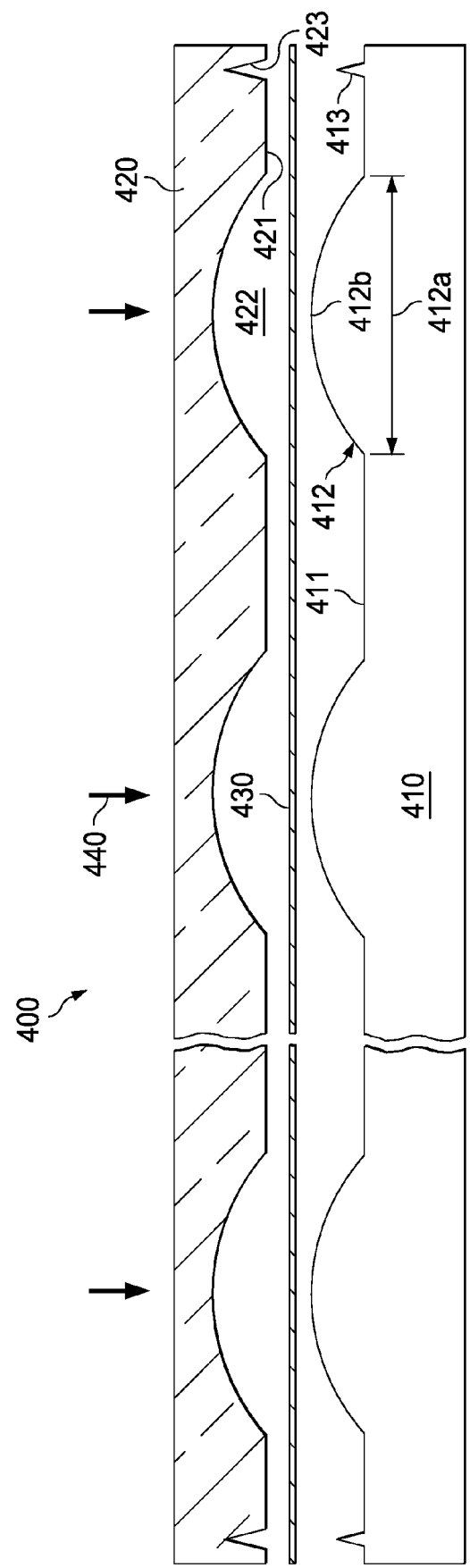

FIG. 4 shows a cross section of an exemplary forming tool used in the manufacturing method as a two-dimensional embosser. The tool, generally designated 400, has a bottom half 410 and a top half 420. In a preferred embodiment, the bottom half of the embosser is made of steel, and the top half is made of a material such as glass, quartz, or clear plastic, which are optically clear to laser light. When other forms of focused energy are used (for instance heat or infrared radiation), top half 402 should be transparent to that form of energy.

Referring to FIG. 4, bottom embosser half 410 has a flat surface 411. Protruding from surface 411 are bulges 412 and pointed pins 413. Bulges 412 are preferably rounded so that cross sections of the bulges parallel to surface 411 decrease monotonically from the widest bulge dimension 412a at surface 411 towards the bulge apex 412b. The locations of the bulges 412 match the locations of the MEMS devices 301 in FIG. 3. The size of the bulges 412 (linear dimensions such as diameter and outline, and height) encompass the size of the MEMS devices 301 in FIG. 3.

Referring now to FIG. 4, top embosser half 420 has a flat surface 421. Hollowed into surface 411 are depressions 422 and pointed indents 423. The location, shape and size of depressions 422 match the location, shape and size of the respective bulges 412. The location, shape and size of indents 423 match the location, shape and size of the respective pins 413.

FIG. 4 further shows a flat foil 430 extended between the bottom embosser half 410 and the top embosser half 420. In the preferred embodiment, foil 430 is made of metal, for example aluminum, copper, stainless steel, or alloys thereof; alternatively foil 430 may be made of a plastic compound if package hermeticity against water and oxygen molecules is not required. The preferred thickness range of foil 430 is in the range from about 5 to 15 μm; alternatively, when suitable sealing techniques are available, the foil may be thicker, up to the millimeter range. Arrows 440 in FIG. 4 indicate the direction of the movement of top embosser half 420 towards bottom half 410.

Figure 5:
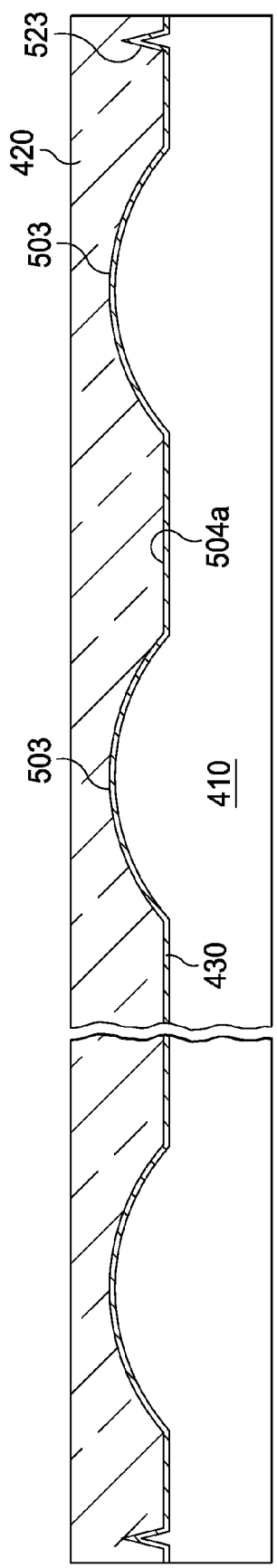

In the next process step, top embosser half 420 is moved towards bottom half 410 in order to close the embosser. This movement is indicated in FIG. 4 by arrows 440. The result of closing the embosser is illustrated in FIG. 5. Foil 430 is squeezed between bottom half 410 and top half 420 so that the foil is formed into bulges 503 exhibiting the shape of the depressions, with flat foil portions 504a remaining between the depressions. Additional foil portions are pressed into the shape of indents 523. In the batch process step of FIG. 5, the plurality of bulges 503 needed for the plurality of respective MEMs devices (see FIG. 3) is fabricated in a single process step.

Figure 6:
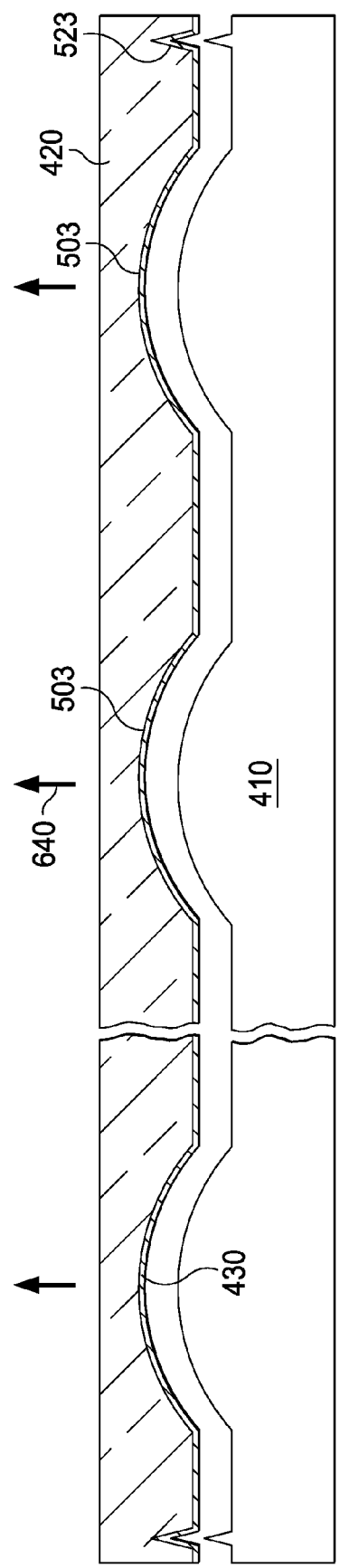

In the next process step, shown in FIG. 6, the embosser is opened, indicated by arrows 640, by lifting top embosser half 420 from bottom half 410. As FIG. 6 indicates, in this lifting process foil 430 remains clinging to the top embosser half since the foil portions 523 remain tacked in the indents of top half 420.

Next, top embosser half 420 including the clinging foil 430 is transported to the MEMS devices attached to the carrier (see plurality of MEMS devices depicted in FIG. 3). As illustrated in FIG. 7, top half 420 together with the clinging foil 430 is aligned with the surface of the device carrier 110 so that the foil 503 in each depression of the top half 420 is aligned with the location of a respective device 101, and the flat foil portions 504a between the depressions with the attachment stripes 122 surrounding each device 101.

As indicated by arrows 740 in FIG. 7, top half 420 is lowered onto the carrier 110 until the flat portions 504a of the foil touch the attachment stripes 122. The foil portion touching strip 122 is designated 722 in FIG. 7. At this stage, the foil 503 in each depression of the top half 420 forms bulges arching over the devices 101.

FIG. 7 further illustrates that a source 750 focuses energy-carrying radiation 751 through the transparent top half 420 unto the touching foil portion 722 and stripe 122. The radiation energy is absorbed by foil portion 722 and stripe 122 to raise the local temperature until the materials of the foil (for example, second metal) and of the stripe (for example, first metal) are locally sealed together. It is preferred that the radiation source is movable in the x- and the y-direction to forms a seal seam along the attachment stripes surrounding each MEMS device. As an example, when foil 755 and stripe 122 are made of aluminum, focused radiation 751 preferably is movable laser light and the action of sealing includes welding. The laser beam 751 can be moved quickly so that the welding of the foil to the attachment stripe can be accomplished in a short period of time. The sealing by metal-to-metal welding results in a fully hermetic seal of the metallic encapsulation to the carrier (for instance, the semiconductor chip).

For devices requiring only quasi-hermetic packages, a polymeric adhesive compound may be used for attaching the foil bulges to the carrier stripes or to the carrier surface in the absence of a stripe. To harden (polymerize) the compound, it may be practical to use an energy source for focused radiation. On the other hand, or some compounds an aging process at elevated temperatures may be sufficient.

With the foil attached to the carrier, the top embosser half can be lifted from the foil. After the top embosser half has been separated and removed, FIG. 8 depicts the MEMS devices 101 on the carrier 110 encapsulated by the bulges 503 of the foil, which is attached to the carrier by the seal seams 822 to the stripes surrounding the devices.

Figure 9:
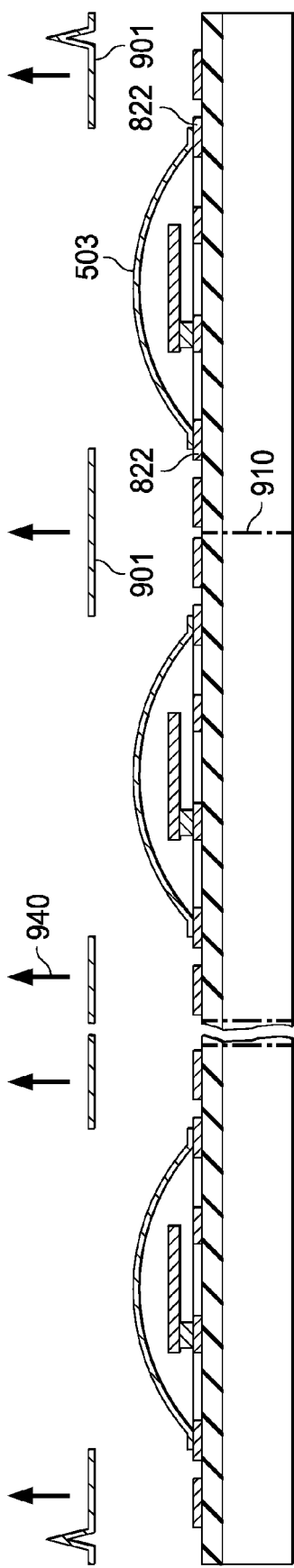
Figure 10:
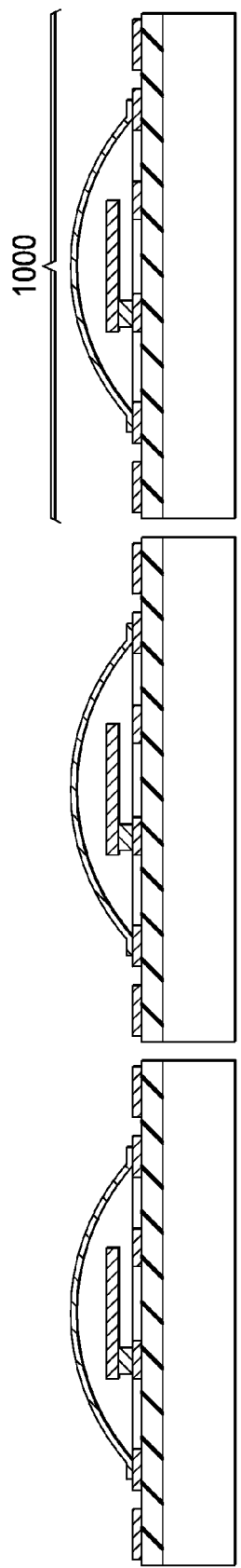

FIG. 9 depicts the next process step of removing (arrows 940) the flat foil portions 901 between the seal seams 822. The thin foil is broken at the seal seams 822 and the flat foil portions 901 are lifted (arrows 940). Dashed lines 910 indicate where the carrier (for instance the semiconductor wafer) will be cut in order to singulate the encapsulated devices. A preferred cutting technique is sawing. FIG. 10 shows the discrete packaged MEMS devices 1000 after the step of singulation.

In an alternative method, the bottom embosser half is configured so that the pins 413 are replaced by sharp ridges surrounding each MEMS devices just outside of the foil attachment locations. Consequently, simultaneous with the step of closing the embosser halves and forming the foil (see FIG. 5), the foil is cut so that only each foil portion with the bulge 503 remains clinging to the top embosser half while the connecting foil portions are cut away. Only the bulged foil portions arrive thus at the sealing step of FIG. 7, and the process step depicted in FIG. 9 becomes superfluous.

Figure 11:
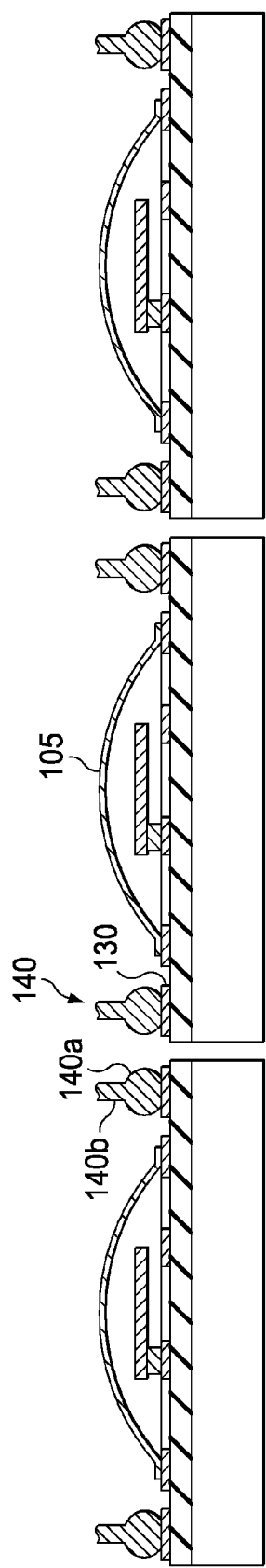

FIG. 11 shows connectors 140 attached to the contact pads 130 of the singulated devices. A preferred technique of fabricating connectors is wire bonding using wires made of gold, copper, aluminum, or alloys thereof. A free air ball 140*a* is formed and attached by squashing it to the pad. The wire is broken off in the mechanically weak heat-affected zone, at a length 140*b* sufficient to be higher than the zenith of the foil bulge. Alternatively, connecting conductive columns, for instance made of copper of a copper alloy, may be deposited on the contact pads.

Figure 12:
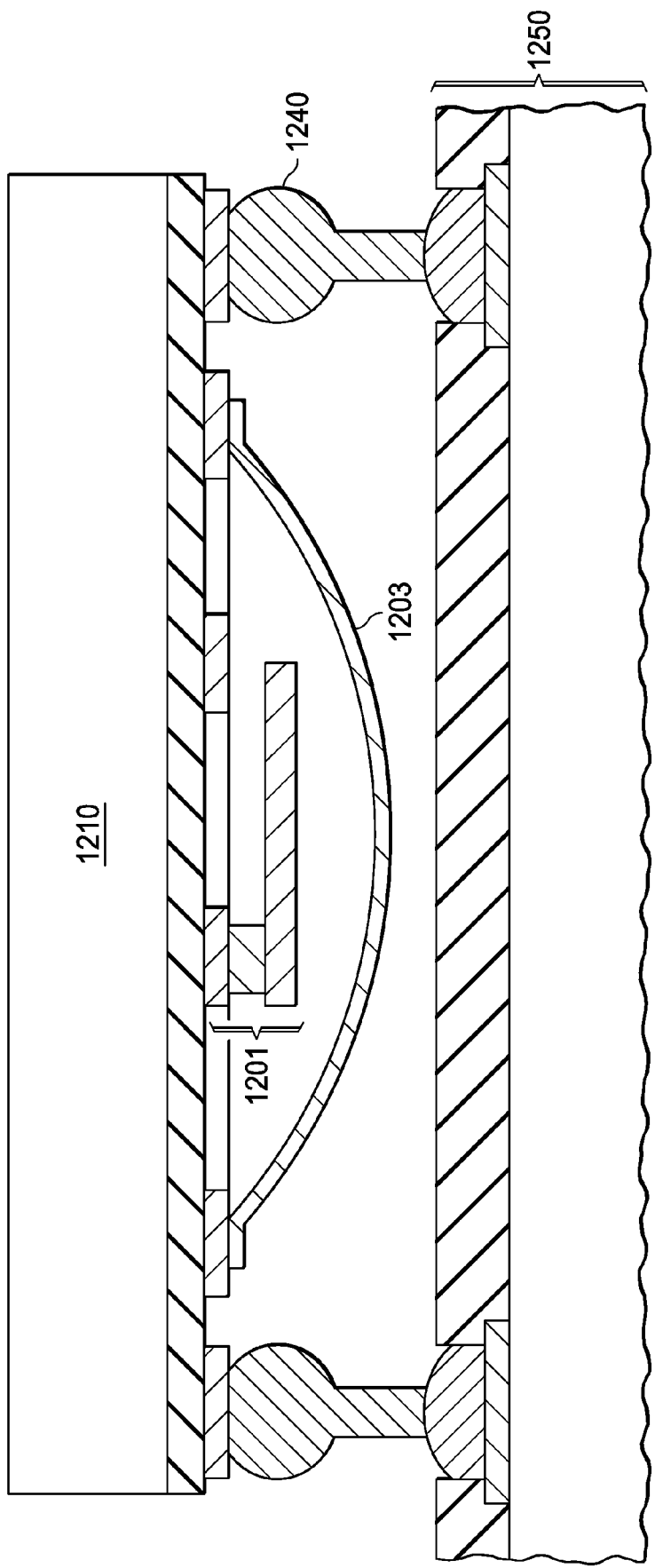
FIG. 12 is a schematic cross section of an exemplary MEMS device encapsulated according to the invention and flip-assembled on a board.

FIG. 12 displays an example (not to scale) of a discrete MEMS device 1201, attached to a semiconductor carrier 1210 and hermetically encapsulated by metal 1203, which is flip-assembled by broken-off ball bonds 1240 on an external board 1250. The overall length of the device may be between about 40 and 100 μm and the height about 10 to 30 μm.

Figure 13:
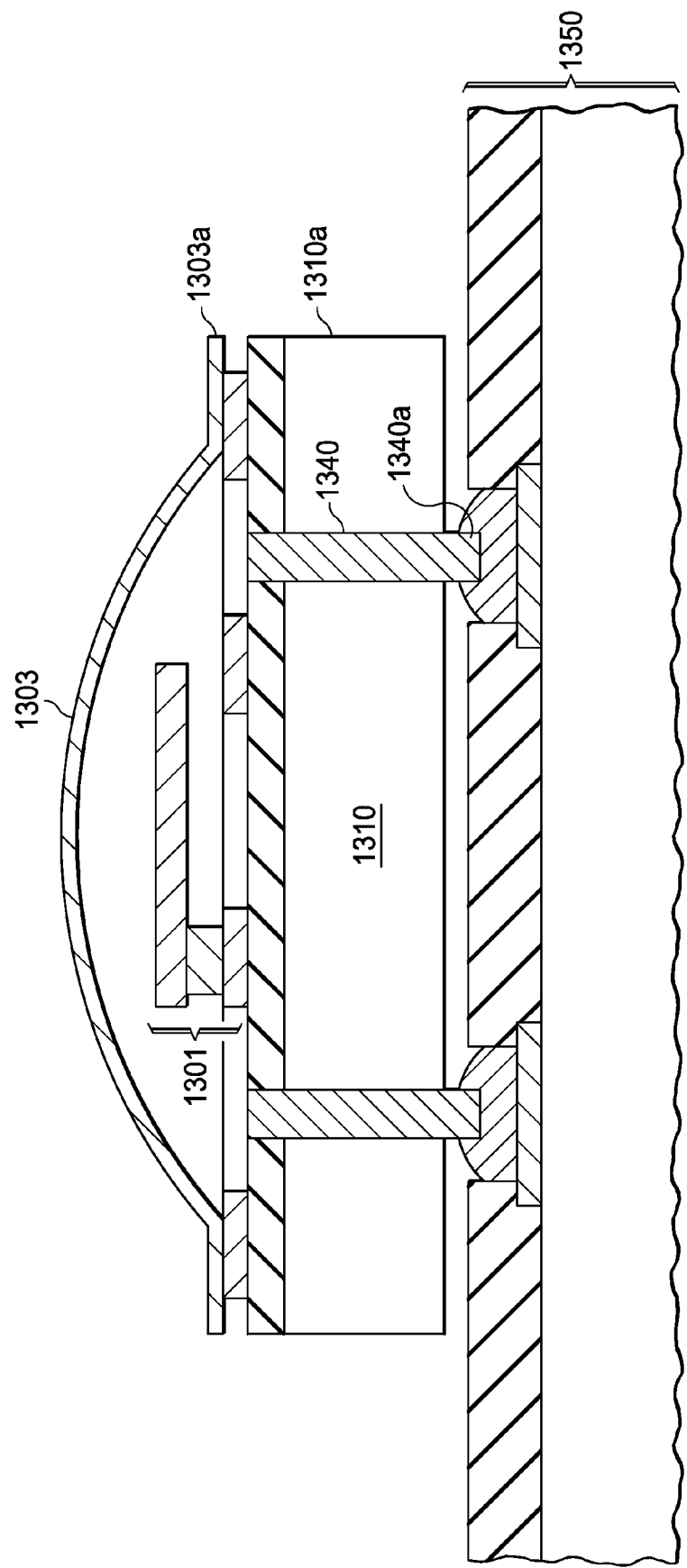
FIG. 13 is a schematic cross section of another exemplary MEMS device encapsulated according to the invention and assembled on a board.

Another example (not to scale) of an assembled MEMS device in a hermetic package is shown in FIG. 13. In this example, metal-filled through-silicon via-holes (TSVs) 1340 provide the electrical connection from the external board 1350 to the MEMS device 1301 under the metal bulge 1303. The assembly onto the contacts of board 1350 is enabled by extensions of the metal filling the vias, wherein the extensions serve as micro bumps 1340*a* for the assembly. Compared to the device example with the broken-off ball bonds (see FIG. 12), the surface mount assembly of FIG. 13 allows for still smaller MEMS devices, further for a singulation process, wherein the saw cuts concurrently through the metal foil 1303 (creating edge 1303*a*) and the semiconductor carrier 1310 (creating edge 1310*a*).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the encapsulation method can be extended to package any semiconductor device on a substrate so that it is fully hermetic, or quasi-hermetic, without immersion in a pervasive material such as a polymeric molding compound. The foil bulge with its cross sections parallel to the substrate monotonically decreasing from the bulge rim to the bulge apex provides hermetic housing on a low cost, quick turn-around, and customer-oriented level.

As another example, the carrier is metallic and has a plurality of via holes, with a connector in each via, to the devices assembled on the carrier (the connectors, of course, are insulated from the metallic carrier), and the device is encapsulated by the dome-shaped metal foil. In this fashion, the device is electrostatically shielded against radiation in a package simulating a Faraday cage/screen.

As another example, the method can be extended beyond the fabrication of semiconductor packages to the encapsulation of any devices on a substrate, of a micrometer scale as well as orders of magnitude larger, where hermeticity, partial or full, is essential and the bulging foil over the device has cross sections parallel to the substrate monotonically decreasing from the bilge rim to the bulge apex.

It is therefore intended that the appended claims encompass any such modifications or embodiments.

We claim:

1. A method for fabricating a package for a device, comprising the step of: forming, by an embosser having a bottom half and a top half, the top half transparent to radiation, a bulge in a foil; leaving flat portions of the foil comprising a rim around the bulge; positioning on a surface of a carrier, the foil clinging to a portion of the embosser; and sealing the rim of the bulge embossed in the foil onto the surface of the carrier having a device on the surface, so that the bulge vaults over the device.

2. The method of claim 1 wherein the device includes micro-electro-mechanical (MEMS) device.

3. The method of claim 1 wherein the foil includes a metal selected from a group including aluminum, copper, and alloys thereof.

4. The method of claim 1 wherein the carrier is a semiconductor chip.

5. The method of claim 1 wherein the embosser bottom half having a flat surface with a rounded bulge, the bulge location matching the device location and the bulge size encompassing the device size; the top half having a flat surface with a rounded depression, the depression location and size matching the bulge location and size.

6. The method of claim 5 further including indents in the top embosser half to enable clinging of the embossed foil to the top half for the step of moving.

7. A method for fabricating a package for a device, comprising the steps of:
   providing a carrier having a surface including devices and attachment stripes, each stripe spaced from a respective device and surrounding the device;
   providing an embosser having a bottom half and a top half, the top half transparent for radiation;
   the bottom half having a flat surface with rounded bulges and pointed pins, the bulge locations matching the device locations and the bulge size encompassing the device size;

the top half having a flat surface with rounded depressions and pointed indents, the depression locations and size matching the bulge locations and size, and the indent locations and size matching the pin locations and size;

extending a flat foil between the bottom and top embosser halves;

closing the embosser, thereby squeezing the foil between the bottom and top halves so that the foil is formed into the shape of the depressions with flat foil portions remaining between the depressions;

opening the embosser, whereby the formed foil remains tacked by the indents and thus clinging to the top embosser half;

aligning the top half including the clinging foil with the carrier surface so that the foil in each depression is aligned with the location of a respective device, and the flat foil portions between the depressions with the stripes surrounding each device;

lowering the top half onto the carrier until the flat foil portions touch the attachment stripes and the foil bulges arch over the devices; and focusing energy-carrying radiation through the transparent top half unto the touching foil and stripes to raise a local temperature until the second and first metals are locally sealed together, forming a seal seam along the stripes surrounding each device.

8. The method of claim 7 further including the steps of:
removing the top embosser half;
removing the flat foil portions between the seal seams; and
singulating the devices by cutting the carrier into discrete units.

9. The method of claim 1 focusing energy-carrying radiation through the transparent top half of the embosser.

* * * * *